United States Patent [19]
Fletcher et al.

[11] Patent Number: 5,283,787
[45] Date of Patent: Feb. 1, 1994

[54] SYNCHRONIZATION OF DIGITAL AUDIO SIGNALS

[75] Inventors: William H. Fletcher, Leicester; Simon C. Wegerif; Christopher J. Travis, both of London, all of United Kingdom

[73] Assignee: British Broadcasting Corporation, London, England

[21] Appl. No.: 688,122

[22] Filed: Apr. 19, 1991

[30] Foreign Application Priority Data

Apr. 20, 1990 [GB] United Kingdom ............ 9008932.7

[51] Int. Cl.⁵ .............................................. H04J 3/06
[52] U.S. Cl. ................................. 370/105.3; 375/118
[58] Field of Search ................ 370/102, 84, 101, 108, 370/100.1, 105.3; 375/118, 111, 112, 114; 369/60

[56] References Cited

U.S. PATENT DOCUMENTS

| | | | |
|---|---|---|---|
| 3,423,534 | 1/1969 | Pan | 375/118 |
| 3,825,683 | 7/1974 | Pitroda et al. | 375/118 |
| 4,151,373 | 4/1979 | Widmer et al. | 370/102 |
| 4,224,473 | 9/1980 | Kaul et al. | 370/84 |
| 4,348,754 | 9/1982 | Haynes et al. | 369/60 |
| 4,791,652 | 12/1988 | McEachern et al. | 370/102 |
| 4,811,340 | 3/1989 | McEachern et al. | 375/118 |
| 4,928,275 | 5/1990 | Moore et al. | 370/102 |
| 5,014,271 | 5/1991 | Fujimoto et al. | 370/102 |

FOREIGN PATENT DOCUMENTS

| | | |
|---|---|---|
| 0048586 | 9/1981 | European Pat. Off. . |
| 0086658 | 2/1983 | European Pat. Off. . |
| 2030740A | 9/1978 | United Kingdom . |

Primary Examiner—Douglas W. Olms
Assistant Examiner—Ajit Patel
Attorney, Agent, or Firm—Robert F. O'Connell, Dike, Bronstein, Roberts & Cushman

[57] ABSTRACT

A digital audio signal which is subject to sample-to-sample jitter is synchronised with local reference pulses by the use of a read-write buffer memory. Timing pulses are associated with the input samples. The input samples are applied through a one-sample latch store to the main memory, and the timing pulses are applied by switches either directly or a short delay to the write control input of the main memory. A phase comparator detects sample-by-sample when the write pulses are near to the read pulses and causes the switches to change state in response thereto, and they retain their changed state until a danger of potential read-write contention is again detected when they revert to their original state.

8 Claims, 2 Drawing Sheets

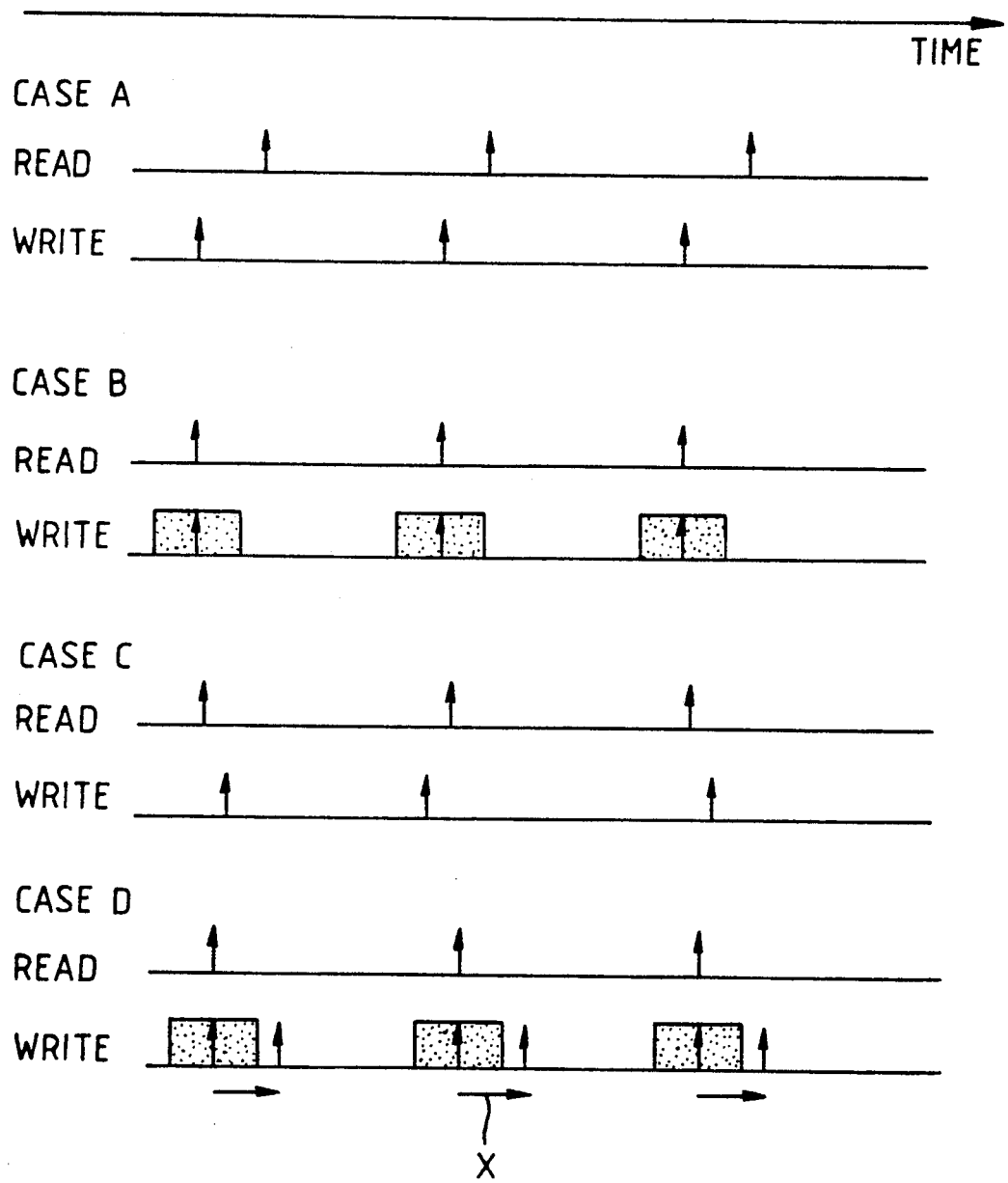

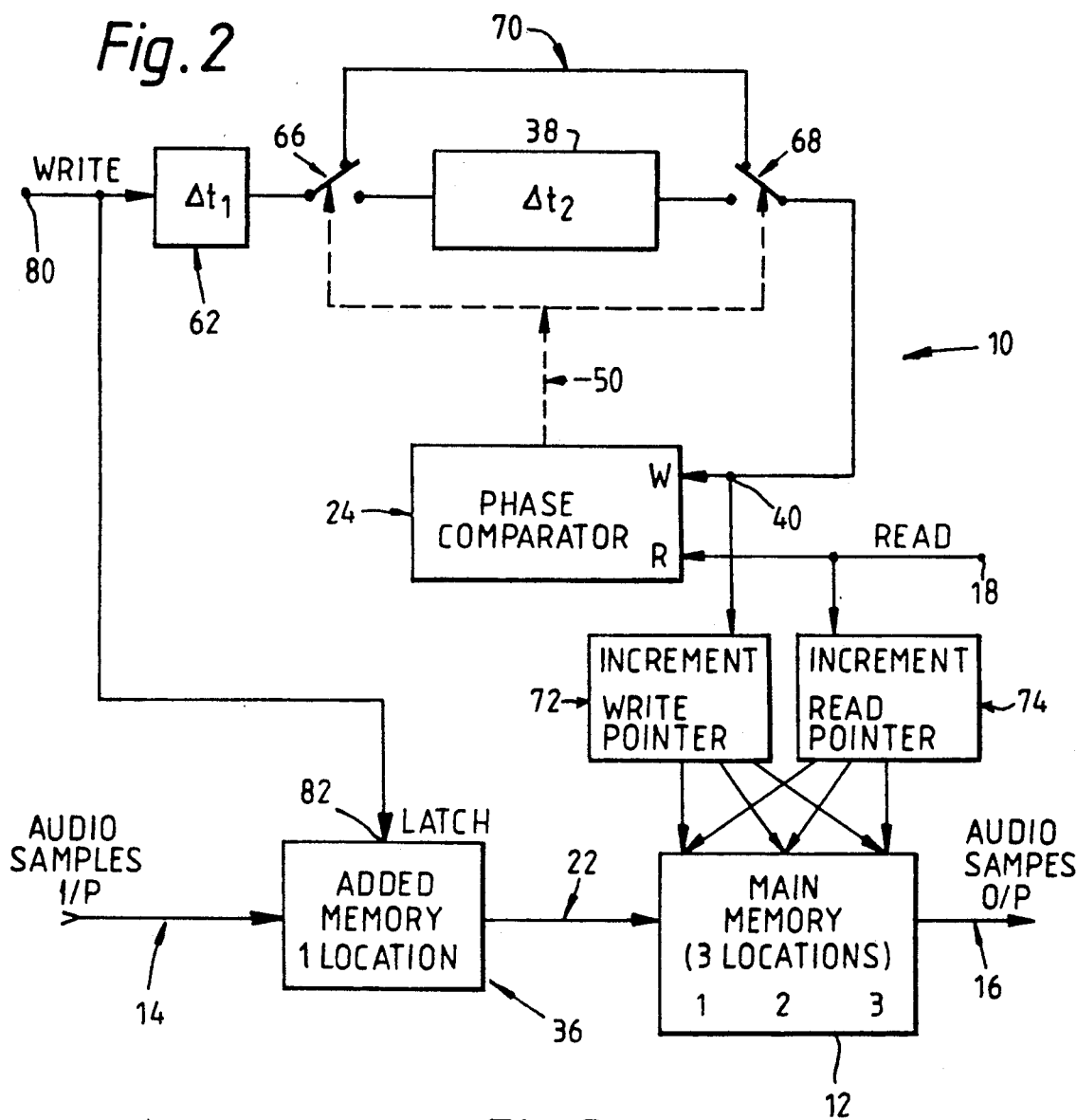
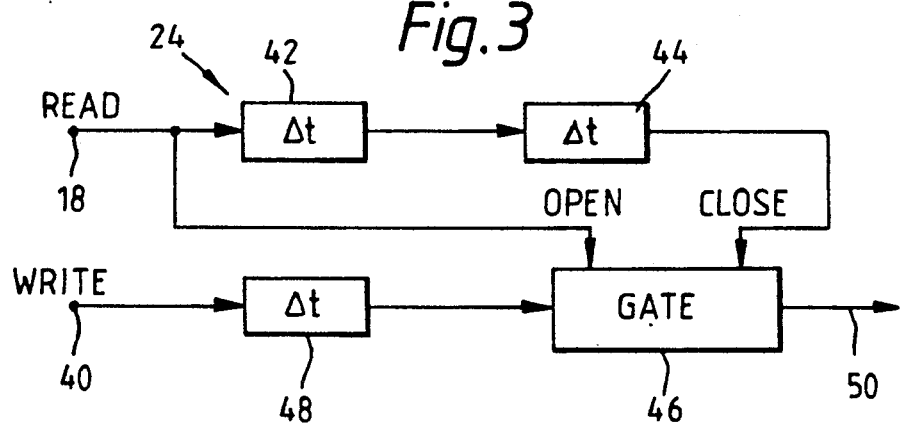

SYNCHRONIZATION OF DIGITAL AUDIO SIGNALS

BACKGROUND OF THE INVENTION

This invention relates to the reception and synchronisation of digital signals, and particularly digital audio signals.

In large multichannel digital audio systems FIFO (first in, first out) stores are commonly used to delay audio samples for synchronisation purposes. Constraints are placed on the relative timing of the read and write operations for these stores. Such a store has a "busy" output line which is enabled whenever either a write operation or a read operation takes place which inhibits any simultaneous attempt at a read or write operation respectively.

In normal operation write and read operations take place alternately. However, if the write and read operations occur more or less in phase with one another, then a small amount of jitter or timing uncertainty on the received samples may have the effect of momentarily reversing the order in which the write and read operations occur. This will result either in repeated samples or in lost samples, and consequent degradation of the sound quality.

This is illustrated in FIG. 1 of the drawings, which shows WRITE and READ operations in four different situations. In case A, the READ and WRITE pulses are widely separated in time. In case B, READ and WRITE are closer than the maximum timing uncertainty, which is represented by the shaded regions. The result of this can be as in case C, where READ and WRITE occur in what is effectively a random order each cycle.

This is thus an example of a situation where an asynchronous input signal subject to sample-to-sample jitter is required to be synchronised with a local reference by the use of a read-write buffer memory.

SUMMARY OF THE INVENTION

The invention is defined in the appended claims to which reference should now be made.

A preferred digital signal receiving and synchronising system embodying the invention and designed particularly for use with audio signals is described in more detail below with reference to the drawings. In the preferred system, a digital audio signal which is subject to sample-to-sample jitter is synchronised with local reference pulses by the use of a read-write buffer memory. Timing pulses are associated with the input samples. The input samples are applied through a one-sample latch store to the main memory, and the timing pulses are applied by switches either directly or a short delay to the write control input of the main memory. A phase comparator detects sample-by-sample when the write pulses are near to the read pulses and causes the switches to change state in response thereto, and they retain their changed state until a danger of potential read-write contention is again detected when they revert to their original state.

BRIEF DESCRIPTION OF THE DRAWINGS

The invention will be described by way of example with reference to the drawings, in which:

FIG. 1 (referred to above) is a timing diagram illustrating the relative timing of WRITE and READ pulses when the WRITE pulses are subject to jitter;

FIG. 2 is a block circuit diagram of a preferred digital audio receiver and synchroniser embodying the invention; and FIG. 3 is a block circuit diagram of the phase comparator circuit 24 of FIG. 2.

DETAILED DESCRIPTION OF THE PREFERRED EMBODIMENT

FIG. 2 is a block schematic of one embodiment of the invention. The circuit 10 illustrated includes a FIFO store 12 which can contain three input samples and provides a buffer function for the audio samples received at an input 14. The audio signals are received in conjunction with a WRITE timing signal at a terminal 80. The memory 12 provides output samples to an output 16 in response to READ pulses received at a terminal 18 and applied to a read control circuit 74. The output samples may then be applied to a digital to analogue converter for example. The converter requires audio sample data consistently synchronous with the READ pulses.

The write pulses at input 80 are associated with audio samples received at the input 14, and in this case both are derived from the same source, though the write pulses may be produced in other ways. In normal operation, these pulses are used as a latching signal applied to the latching input 82 of an added memory 36, and a short time $\Delta t_1$ later after passing through a delay element 62, as write pulses for the main memory 12. $\Delta t_1$ is a very short delay equal to the propagation delay of the added memory 36. The output of the added memory 36 is connected directly to the input of the main memory by line 22. Thus, in normal operation, the added memory behaves virtually transparently, adding a small propagation delay to the input of the main memory.

A phase comparator 24 compares the write and read pulses applied to the main memory. If a write pulse approaches too closely to a read pulse, the phase comparator provides a single pulse at its output. This pulse is applied by control line 50 to switches 66,68. These switches allow a relatively long delay element 38 of delay $\Delta t_2$ to be admitted into the write signal path. Thus, dependent upon the positions of linked switches 66,68 the write pulses arrive at the write control circuit 72 of the main memory either directly through line 70, or through the delay 38 of value $\Delta t_2$. The magnitude $\Delta t_2$ of the delay 38 is greater than the overall expected peak-to-peak timing jitter as shown by the shaded area in FIG. 1 at B. The added memory 36 contains one location, and therefore requires only a latch signal 82. The output of this additional memory on line 22 is equal to the latched contents after a short propagation delay.

The system checks read and write signal pulses for every incoming audio sample, and is thus able to follow sample-by-sample timing variations of the type found in digital audio systems (as opposed to slowly drifting variation relative to a fixed reference). Each measurement relates to an individual sample.

Switches 66,68 change state each time a pulse is received from the phase comparator i.e. they operate as toggles. That is, once the delay 38 has been brought into use, further measurements are made using the thus-delayed WRITE pulses, until potential read/write contention is again detected. Then the delay 38 is no longer used. Such an arrangement makes for a much more elegant design and only requires a few memory locations.

When used in a digital audio environment the maximum allowable jitter can be defined for a given level of communication link performance. The phase or timing difference is measured by reference to a high frequency clock, that is a clock which has a frequency much higher than the data rate. This measurement itself introduces an additional jitter component which must also be allowed for in the calculation of delay value $\Delta t_2$. If the measured phase difference is greater than the peak jitter possible, then data passes transparently through the additional memory 36 subject to a small delay $\Delta t_1$. If the measured phase difference is smaller than the maximum jitter possible, then the data is held in the additional memory for a much longer time $\Delta t_2$. After this time it is written to main memory.

The net result is to move the write operation a safe distance in time away from +,he read operation. This is illustrated at D in FIG. 1, where the WRITE pulses are delayed by a fixed amount X greater than the timing uncertainty.

The relative phases of the write and read operations then continue to be monitored by the phase measurement circuit and, if a clash is again detected, the additional store is effectively rendered transparent.

Conveniently the additional memory 36 and the main memory 12 can be constituted by a single 4-sample memory with the additional memory 36 being constituted by the first sample location of the memory.

FIG. 3 illustrates a possible circuit for use as the phase comparator 24 to detect instances of potential read/write contention. Read pulses are received at terminal 18 and write pulses at a terminal 40. The read pulses are applied through two delays 42,44 of the same length as delay 38. A gate 46 is opened by the read pulses received at terminal 18 and is closed by the pulses from the output of delay 44. The write pulses are applied to a similar delay 48 and thence to the gate 46. If a delayed write pulse arrives at the gate when it is open, then the pulse passes through the gate and toggles the switches 66,68.

The circuits illustrated can be implemented in the form of an integrated circuit device and can be incorporated into a digital audio interface in accordance with IEC 958. They have the advantage of providing synchronism in a system where the master clock is not derived from the input pulses and yet provide a very small overall delay to the signal.

We claim:

1. A method of receiving a digital signal, input data samples of which are subject to timing uncertainty due to jitter, and synchronizing said input data samples with a reference source, comprising the steps of:
   providing a main read-write memory capable of storing at least one input data sample and having a data input, a data output, a write control input and a read control input;
   selectively applying the input data samples and timing pulses related to the input data samples to the main memory either in one mode by applying undelayed timing pulses to the write control input of the main memory so as to supply the input data without delay, or in another mode by applying delayed timing pulses to the write control input through a timing pulse delay means so as to supply the input data samples to the data input of the main memory after a time delay; and
   comparing successive timing pulses applied to the write control input and the read control input of the main memory, and if the pulses approach to within less than a predetermined time interval related to the timing uncertainty due to jitter of the input samples, changing the mode of application of the timing pulses and input data samples to the main memory.

2. A method according to claim 1, in which the digital signal is a digital audio signal.

3. Digital signal receiving and synchronizing apparatus for receiving a digital signal, data samples of which are subject to timing uncertainty due to jitter, and synchronizing said data samples with a reference source, comprising:
   means for receiving data samples of the digital signal to provide a signal input;
   means for providing timing pulses corresponding to the receipt of data samples at the receiving means;
   a terminal for receiving reference pulses with respect to which the data samples are to be synchronized;
   a main read-write memory means capable of storing at least one data sample and having a data input, a data output constituting the output of the apparatus, a write control input, and a read control input connected to said terminal to receive reference pulses;
   additional memory means capable of storing one data sample,
   a timing pulse delay means connected to said timing pulse providing means for providing delayed timing pulses;
   selector means having a control input and being operative in a first condition to apply undelayed timing pulses from the timing pulse providing means to the write control input of the main memory means so as to supply said signal input through the additional memory means to the data input of the main memory means substantially without delay, and being operative in a second condition to apply delayed timing pulses from the timing pulse delay means to the write control input of the main memory means so as to supply said signal input through the additional memory means to the data input of the main memory means after a time delay; and
   timing comparison means connected to receive successive pulses applied to the write control input and to the read control input of the main memory means for comparing the timing thereof and, if the pulses approach to within less than a predetermined time interval related to the timing uncertainty due to jitter of the input signal, changing its operative condition from its first condition to its second condition, or from its second condition to its first condition.

4. Apparatus according to claim 3, in which the timing pulse delay of said timing pulse delay means is at least equal to said predetermined time interval.

5. Apparatus according to claim 3, in which in the first condition of the selector means the additional memory means is effectively rendered transparent to the input signal.

6. Apparatus according to claim 3, in which the main memory means is capable of holding up to three samples.

7. Apparatus according to claim 3, in which the main memory means and the additional memory means are constituted by a single memory, the main memory means and the additional memory means comprising first and second portions of said single memory.

8. Apparatus according to claim 3, in which the timing comparison means comprises first timing comparison delay for delaying reference pulses received at the said terminal by an amount substantially twice the timing pulse delay of said timing pulse delay means; a second timing comparison delay for delaying the pulses applied to the write control input of the main memory means by an amount substantially equal to the timing pulse delay of said timing pulse delay means; and gate means having an input connected to receive the delayed write pulses from the second timing comparison delay and an output constituting the output of the timing comparison means, and having an OPEN input connected to the same terminal to receive the reference pulses to open the gate means and a CLOSE input connected to the output of the first timing comparison delay to close the gate means in response to the delayed reference pulses.

* * * * *